United States Patent Office
3,564,355
Patented Feb. 16, 1971

3,564,355

SEMICONDUCTOR DEVICE EMPLOYING A P-N JUNCTION BETWEEN INDUCED P- AND N-REGIONS

Kurt Lehovec, Williamstown, Mass., assignor to Sprague Electric Company, North Adams, Mass., a corporation of Massachusetts Continuation-in-part of application Ser. No. 703,958, Feb. 8, 1968. This application Aug. 2, 1968, Ser. No. 749,651
Int. Cl. H01l 11/14
U.S. Cl. 317—235 13 Claims

ABSTRACT OF THE DISCLOSURE

Semiconductor devices are formed by the induction of p- and n-regions into a high resistivity or semi-insulating-semiconducting film by means of electric fields applied perpendicular to the semiconductor film. By changing the field magnitude and/or polarity, the location and conductivity of the p- and n-regions can be varied thereby varying the characteristics of the device.

CROSS-REFERENCE TO RELATED APPLICATION

This application is a continuation-in-part of U.S. patent application 703,958 filed Feb. 8, 1968, and issued on Oct. 14, 1969 as U.S. Pat No. 3,473,032.

BACKGROUND OF THE INVENTION

This invention relates to semiconductor devices formed by the induction of p- and n-regions into a semiconductor material and, more particularly, to the induction of p- and n-regions into an extremely thin semiconducting film by means of an electrical field applied perpendicular to the film's surface.

The aforementioned parent application taught the induction of p- and n-regions in a high resistivity, or semi-insulating, semiconducting body of application of electric fields applied between said body and between electrode pairs separated from the body by an insulating film. Also taught were several methods for shifting the PN junctions formed by these induced regions including the method of changing the intensity and/or polarity of the electric fields applied to the electrodes. It was indicated that the semiconducting device taught in the application was useful in an optical sensing or communication systems wherein both systems could make use of the photoemitting or photosensitive characteristics of the PN junctions between the induced p- and n-regions. It is also possible, however, using the methods previously taught, to form many other useful devices, such as diodes, junction capacitors transistors, etc. and/or a combination of them in the form of integrated circuits. At present, these components and/or circuits are created by diffusion of selected impurities into a semiconductor body. This process is irreversible and, once formed, the characteristics of the particular device do not change under given ambient conditions. It would be desirable to introduce a degree of flexibility into these devices such that their characteristics could be altered in accordance with changed circuit requirements.

It is therefore one object of the present invention to provide for the formation of semiconducting devices which encompass at least one variable p-n junction formed by the induction of appropriately located p- and n-regions in the body of a semiconducting layer of high resistivity.

The induction method, as taught in the parent application, required the induction of p- and n-regions into a wide band-gap, semiconducting body containing either very few active impurities or else a near compensation of p- and n-impurities. In the present state of the microelectronic art, planar technology is widely used to form both discrete devices and integrated circuits and the preferred semiconductor material used in this technology is silicon, a material which does not fulfill the above requirements for a semi-insulating-semiconducting body at the room temperature environment in which the technology is mostly practiced.

It is therefore an additional object to provide for the formation of semiconducting devices which encompasses at least one variable p-n junction formed by the induction of p- and n-regions in a silicon body at room temperature.

It is a further object to provide control over the characteristics of the devices formed as described above by changing the location of said p- and n-regions as required.

It is a still further object to provide for the formation of semiconductor devices in a relatively thicker silicon body at below-room-temperatures and also to form devices in wide band-gap compounds.

SUMMARY OF THE INVENTION

Broadly, a semiconductor device constructed in accordance with the invention comprises a semiconducting layer with a plurality of electrodes adjacent to and electrically isolated from the layer, variable biasing means applied to the electrodes for inducing p-type and n-type conductivity regions in the semiconducting layer and a connection path for an electrical signal through the induced regions to external terminals, said path crossing at least one junction between an induced p- and an induced n-region.

In a more limited sense, the use of an exceptionally thin slice of semiconducting material (silicon about .5 micron thick is used in the preferred embodiment) disposed on the surface of an insulating substrate provides a semiconductor layer which is sufficiently insulating for the purposes of inducing conductive p- and n-regions with minimum leakage therein. In one embodiment, the p- and n-regions are induced by attaching electrodes above the free surface of the film; then, depending upon their relative positions and the magnitude of electric fields applied to them, p-type and n-type regions are induced in the underlying film at desired locations. In another embodiment, the thin semiconducting film is rendered even more insulating by an electric field perpendicular to the film surface of such magnitude and polarity that the free carriers in the film are driven off or depleted. The p- and n-regions are then induced as in the first embodiment. In another embodiment the electrodes are disposed on both the free surface of the substrate and the film.

DESCRIPTION OF THE PREFERRED EMBODIMENTS

Figures 1, 2, 3, 4:
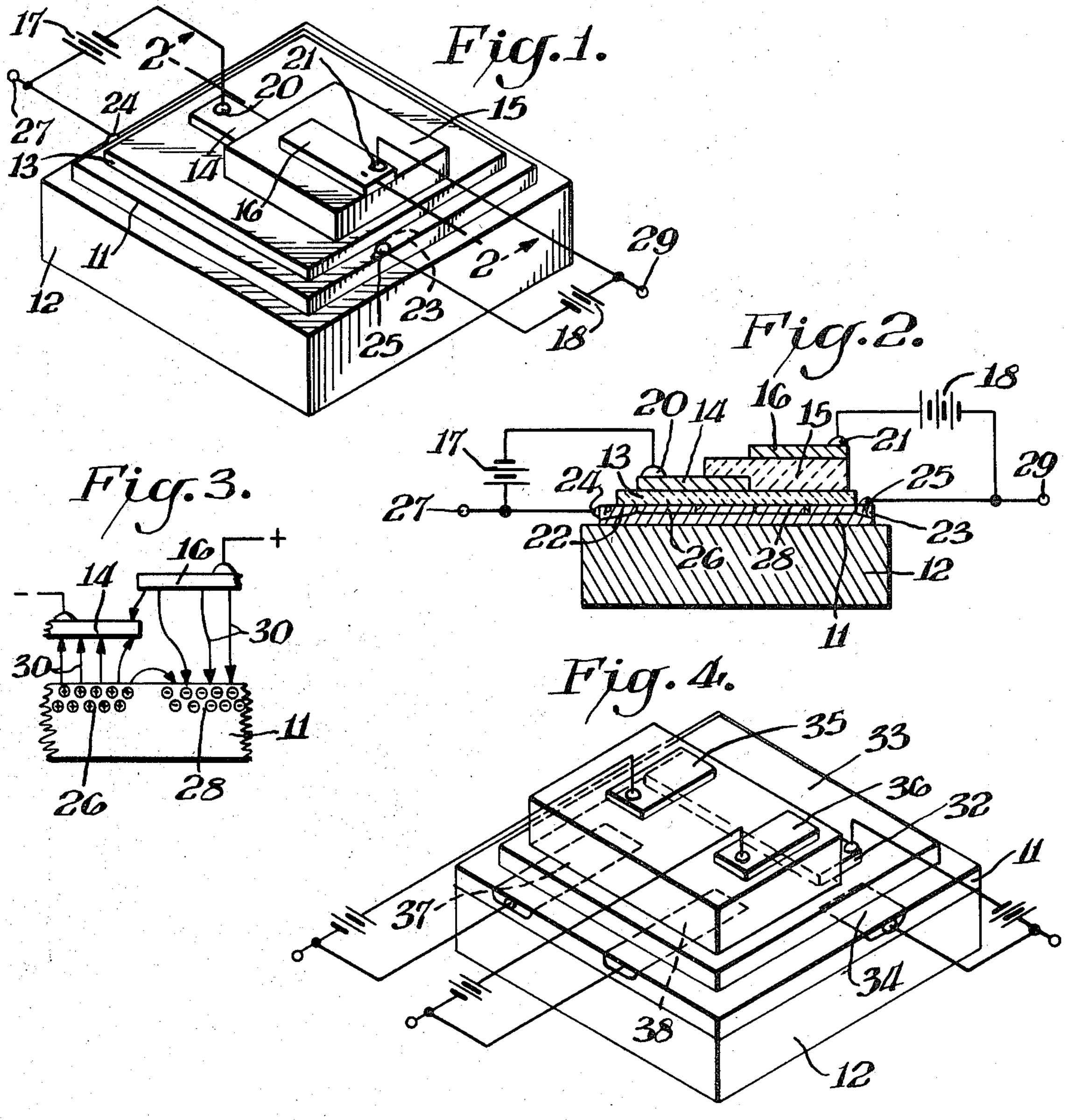
FIG. 1 shows a perspective view of a diode formed in accordance with the invention.
FIG. 2 shows a cross-sectional view of the diode taken along line 2—2 of FIG. 1.
FIG. 3 shows the potential distribution across a PN junction formed in accordance with this invention.
FIG. 4 shows an alternate means for changing the PN junction of the diode of FIG. 1.

FIGS. 1 and 2 show a diode formed in accordancs with the invention. Referring to FIGS. 1 and 2 semiconductor film 11 is deposited on the surface of insulating substrate 12. Insulating layer 13 covers a portion of film 11 and carries, on its surface, a first electrode 14. A second insulating layer 15 is deposited on top of a portion of both layesr 13 and electrode 14 so as to insulate electrode 14 from a second electrode 16 positioned on the free surface of layer 15. Power supplies 17 and 18 are connected to electrodes 14 and 16 respectively, at contacts 20 and 21, and to chemically doped p- and n-regions 22 and 23 respectively at contacts 24 and 25.

In the preferred embodiment, semiconductor film 11 is a layer of single-crystalline silicon approximately 0.5 micron thick and having an impurity concentration of $3\times10^{15}/\text{cm.}^3$ or less. Insulating substrate 12 is a sapphire slice approximately 6 mils thick but can be any other insulator suitable for silicon deposition. The electrodes can include metal films, transparent contacts such as tin oxide and photoconductors such as cadmium sulfide. Insulating layers deposited on the semiconducting film can be formed by several methods: oxidation in the case of silicon; chemical deposition of such materials as $Si_3N_4$ and $SiO_2$ by a vapor phase reaction, electron beam evaporation of insulators, etc. Film thickness in the range between several hundred angstrom units and a few tens of thousand angstrom units are effective.

Referring again to FIGS. 1 and 2, electrode 14 is given a negative bias voltage against film 11 by means of power supply 17. This negative bias creates a field which penetrates insulating layer 13 and induces a hole inversion region (p-type region 26) in film 11 at its interface with layer 13. Chemically doped p-type region 22 carries contact 24 which connects the induced region 26 to external terminal 27. Electrode 16 is given a positive bias charge against film 11 by means of power supply 18. This positive bias creates a field in the film which induces an electron accumulation region (n-type region 28) at the film interface. The surface area of the induced regions is at least equal to the area of the respective inducing electrodes, and although the induced regions are shown pentrating a small distance into film 11, this penetration depth can be increased for one or both regions by increasing the magnitude of the charges on their respective inducing electrode. A typical thickness for the induced conductive layers is approximately 100 angstroms.

Chemically doped n-region 23 carries contact 25 which connects the induced n-type region 28 to external terminal 29. Thus, there exists a path for current flow from the contact 24 to contact 25 across the PN junction formed between two induced regions.

The nature of the field distribution across this PN junction is shown in FIG. 3. This figure shows only the electrodes 14 and 16 of FIGS. 1 and 2 suspended in relation to film 11. The biased electrodes create electric field lines 30 which are distributed as represented in the figure. While the distribution across the PN junction between chemically doped regions would be determined by the dopants used, the distribution for the induced PN region depends on the conductive electrons or holes in the film and on the bias on the inducing electrodes; hence the exact characteristics of the device require the solution of a three-dimensional potential problem.

In FIG. 1, the electrodes are shown to be overlapping and the PN junction formed by the induced layers is shown in FIG. 2 to be approximately equidistant between the common area between the overlapping ends of the electrodes. Assuming the inducing charge for p-region 26 is increased, the PN junction would move slightly to the right since the area of the p-region would be laterally increased at the expense of n-region 28. FIG. 4 shows a top view of an electrode configuration which provides a way of obtaining much greater changes in the location of the PN junction. Electrode 32, located on insulating layer 33, is given a negative bias against chemically doped p-region 34 to induce a p-type region (not shown) in film 11 as previously described. A positive bias applied to either second or third electrodes 35 or 36 against chemically doped n-type region 37 or 38 will induce an n-type region (not shown) in the film beneath the biased electrode creating a PN junction at the superposition of electrode 32 and biased electrode 35 or 36. It is obvious that the PN junction could be formed anywhere along the length of the induced p-region to correspond to desired characteristics of the device by adding additional electrodes along the length of electrode 32.

The embodiment of the invention shown in FIGS. 1 and 2 and 4 result in the creation of an induced circuit path across the doped and the induced p-type and n-type regions to the external terminals. Ideally, this path should have zero leakage between the induced regions and the rest of the semiconducting film 11. The parent application called for a high resistivity semiconducting material which would provide good insulation around the induced regions. Silicon, at room temperature, and in the thickness ordinarily used, is not sufficiently insulating to meet this requirement. By using an extremely thin film of silicon, as taught herein, this leakage current is reduced significantly from that of a thicker silicon body having the same impurity concentration. The leakage can be reduced still further by extending the induced conductivity region through film 11 to substrate 12 (in FIGS. 1 and 2) thereby reducing the contact area between the induced region and the surrounding body the film. Alternatively, the leakage can be reduced effectively by increasing the resistivity (insulation) of the film. This is accomplished as follows. Suppose that the semiconductor film has a concentration of $3\times10^{15}/\text{cm.}^3$, of donor type impurities, for example, antimony in silicon. At room temperature all these impurities would be ionized and their charge would be compensated by $3\times10^{15}$ free electrons per cm.$^3$, providing a conductivity of about 0.6 ohm$^{-1}$ cm.$^{-1}$.

If the positive terminal of an electric field impinges on one of the flat surfaces of such a film, electrons will be removed from a surface layer of thickness $d$ of the slice. This thickness $d$ increases with the field up to an amount $d_\infty$; with further increasing field, $d_\infty$ remains nearly unchanged and p-conductance by a surface layer of holes arises. For a slice having a uniform concentration of donor type impurities N, the thickness $d_\infty$ is given the approximate relation $$d_\infty \simeq 2\sqrt{(kT/q)\ln(N/n_i)\epsilon_s\epsilon_0/Nq}$$

where $kT/q$ is the voltage equivalent of temperature (1/40 volt at room temperature); $\epsilon_s$ is the dielectric constant of the semiconductor, $\epsilon_0=8.84\times10^{-14}$ amp sec./volt cm.: $n_i$ is the intrinsic carrier concentration of the semiconductor, and $q=1.6\times10^{-19}$ coulombs, the elementary charge. For silicon at room temperature, $\epsilon_s\epsilon_0\simeq10^{-12}$ amp sec./volt cm. and assuming $N\simeq3\times10^{15}$ cm.$^{-3}$ one obtains $d_\infty\simeq0.5$ microns. Thus, $Nqd_\infty\simeq2.5\times10^{-8}$ coul./cm.$^2$, and $\epsilon_sF_s=Nqd_\infty\epsilon_0\simeq2.5\times10^5$ v./cm., where $F_s$ is the electric field at the semiconductor surface.

From the above quoted example, full depletion of electrons is only possible if the film thickness is less than 0.5 micron. Of course, in a film doped by less than $3\times10^{15}/\text{cm.}^3$, correspondingly larger film thicknesses can be depleted and suitable conductive layers could be obtained using a depletion layer less thick than $d_\infty$.

The depletion field $F_s$ of $2.5\times10^5/\epsilon_s$ v./cm. can be produced in a variety of ways. One is the external application of an electrical field to a metal electrode separated from the semiconductor by an insulator.

Figures 5, 6:
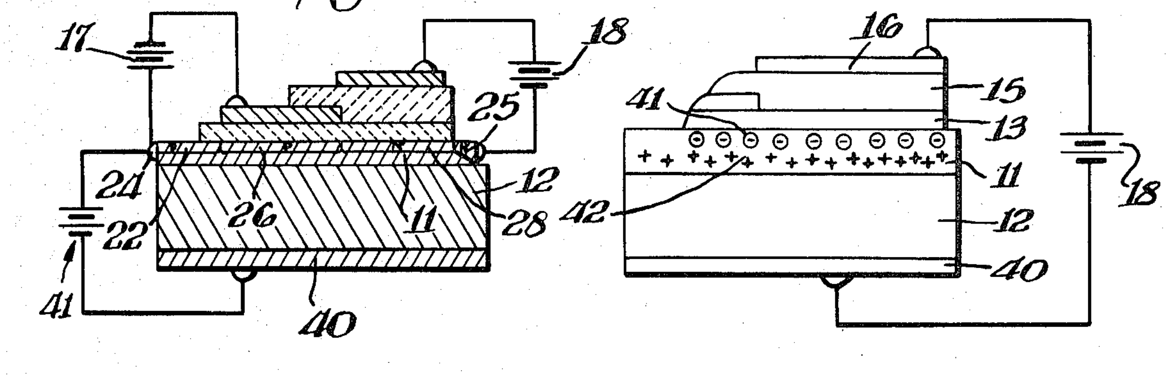
FIG. 5 shows the embodiment of FIG. 1 with an added depletion electrode and biasing means.
FIG. 6 shows another embodiment using a depletion electrode.

Referring to FIG. 5, the configuration of FIG. 2 has been altered by adding depletion layer electrode 40 biased negatively by power supply 41 against film 11 at contact 24. Assuming the insulator 12 has a thickness L and dielectric constant $\epsilon_{in}$, the voltage required for depletion is $$V_d=\frac{Nqd^2}{\epsilon_s\epsilon_o}+\frac{NqdL}{\epsilon_{in}\epsilon_o}$$

The first term arises from the potential drop across the depletion layer in the semiconductor, and is for the numerical example mentioned above $$Nqd_\infty 2/\epsilon_s\epsilon_o\simeq 0.6 \text{ volt}$$

The second term is the potential drop across the insulator 12 which separates the depletion electrode 40 from the semiconductor 11.

Assuming film 11 is slightly less than 0.5 micron, the entire film is in depletion and forms an ideal semiconducting body for isolation of induced p- and n-regions 26 and 28 as previously described.

While the embodiment shown in FIG. 5 shows the inducing electrodes and depletion electrode biased each with respect to film 11, it is also possible to create the depletion layer by applying a bias directly between the inducing and depletion electrode as shown in FIG. 6. Here, voltage source 18 biases n- inducing electrode 16 against depletion electrode 40 leaving film 11 "floating" electrically between them. As a result, the semiconducting wafer remains mainly electrically neutral but an n-type layer 41 establishes near the upper surface of film 11 due to electrons removed from the rest of the wafer. Thus the rest of the wafer becomes an isolating depletion layer causing the positive space charge of combined donor impurities 42.

The field could also be generated, without an external voltage application, by selecting, for depletion electrode 40, a metal having an appropriate work function difference with respect to the semiconductor. For instance, the work function difference between gold and the bottom of the conduction band in silicon is about +0.65 electron volt; while that between Al and the bottom of the conduction band is only +0.15 electron volt. The Fermi-level at room temperature of silicon having a donor impurity concentration of $3\times10^{15}/\text{cm.}^3$ lies 0.25 ev. below the bottom of the conduction band. Therefore, an electric field corresponding to 0.4 volt will be established between gold and such a silicon sample, silicon becoming the positive terminal, while between Al and such a silicon sample a field will establish corresponding to 0.1 volt, silicon becoming the negative terminal. Therefore, a gold electrode could be used for depletion of an n-type semiconductor sample without requiring any externally applied bias. Other metals providing a suitable work function difference include platinum, palladium and nickel. In a a third method, the interface charges between the semiconducting body and the insulating layer covering the body are used to create the depletion layer. For example, in a n-type silicon layer with the values from the previous example and an insulating layer of silicon dioxide, a depletion layer of $d_\infty$ is provided by creating $Nd_\infty=1.5\times10^{11}$ positively charged interface states per $\text{cm.}^2$ of the semiconductor surface.

In a fourth method, an insulator having a space charge concentration of the amount $Nqd_\infty$ per unit area covers the semiconductor. An example is silicon oxide wherein a positive space charge arises "naturally" during oxidation of silicon. This charge can be enhanced by certain foreign ions such as sodium. These foreign ions can be implanted into the silicon oxide by ion bombardment to modify the oxide charge.

Each of the means described above, separately or in combination, are capable of depleting some or all the conduction from the thin semiconductor slice. However, preferred embodiments are the externally applied depletion for ease of control and adjustment: and/or the work function difference in the case of sufficiently thin insulating films (i.e., less than one micron thick). If surface conduction by minority carriers (p-type in our example) is desired, fields in excess of those described above must be generated, i.e., $\epsilon_s F_s$ larger than $2.5\times10^5$ v./cm. in the structure previously described. On the other hand, there is no such lower limit on the magnitude of the field of opposite polarity to generate a surface conduction by majority carriers (n-type in our example).

Figure 7:
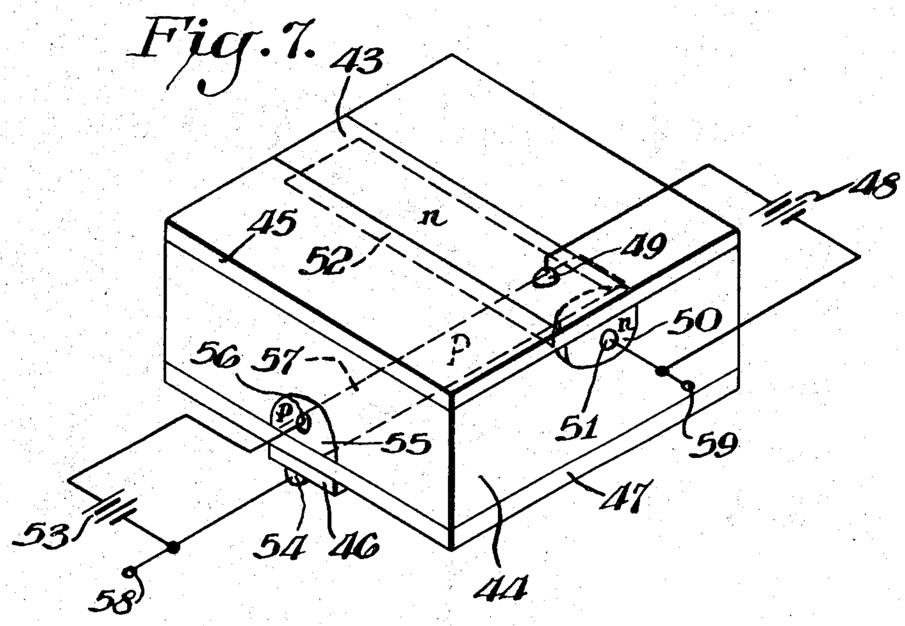
FIG. 7 shows an embodiment of the invention wherein the inducing electrodes are on opposite sides of the silicon film.

While the PN junctions shown in the previous figures have been induced by electrodes located above one surface of the semiconductor, it is possible to form such a junction by placing the electrodes adjacent both film surfaces of the film so long as at least one pair of electrodes on opposing surfaces induce the appropriate type layer. This configuration would allow a plurality of devices to be formed within a film without requiring successive insulating layers on one surface. For example, FIG. 7 shows electrode 43 separated from one surface of film 44 by insulating layer 45 and another electrode 46 separated from the opposing film surface by insulating layer 47. A positive bias from power supply 48 applied to electrode 43 at contact 49 and to chemically doped n-region 50 at contact 51 induces n-region 52 at the surface of film 11 adjacent electrode 43. A negative bias from power supply 53 applied to electrode 46 at contact 54 and to chemically-doped n-region 55 at contact 56 induces p-region 57 at the surface of film 44 adjacent electrode 46. A PN junction is formed over the area where the two induced areas meet, the location of the junction varying with the bias applied. A current path is then completed from terminal 58 to terminal 59 across the land areas, induced regions and across the PN junction.

Figure 8:
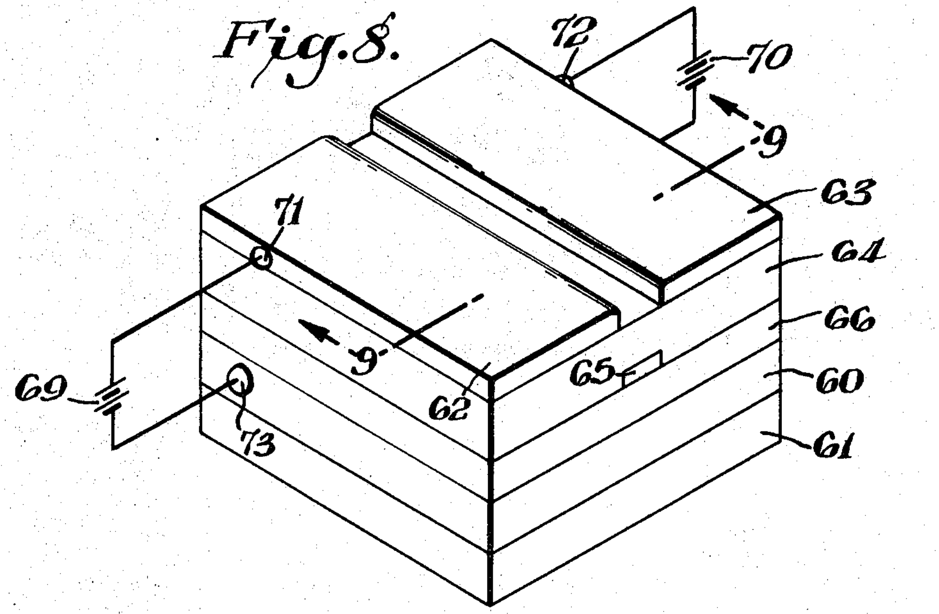
FIG. 8 shows a perspective view of a lateral transistor formed in accordance with the invention.
Figure 9:
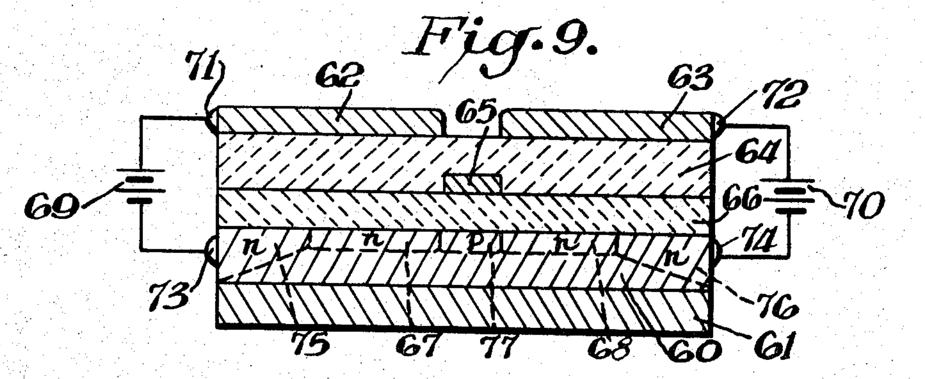
FIG. 9 shows a cross sectional view of the embodiment of FIG. 6 taken along line 8—8.

Although the invention has been illustrated by means of a single p- and n-region to create a simple diode, more elaborate semiconducting devices such as n-p-n-p rectifiers, n-p-n or p-n-p transistors or entire circuits comprising combinations of devices, could be formed using the principles enunciated herein. For example, FIGS. 8 and 9 show another embodiment of the invention, wherein a lateral n-p-n transistor is formed. Semiconducting layer 60 is deposited on insulating substrate 61. Electrodes 62 and 63 are formed on insulating layer 64 in which is buried a third electrode 65. Another insulating layer 66 separates electrode 65 from layer 60 and can serve the additional function of creating the depletion charge previously described. N-regions 67 and 68 are induced in the semiconductor 60 by application of positive potentials from power supplies 69 and 70 through contacts 71 and 72 and 73 and 74. Regions 75 and 76 are chemically doped n-type land areas. P-region 77 is formed by applying negative bias to electrode 65 from a power supply contact and land area not shown. The characteristics of the n-p-n transistor are varied by altering the bias on each electrode or a combination of them.

While the preferred embodiment described the induction of the p- and n-regions in a silicon film about 0.5 micron thick, a lower thickness limit of the semiconductor film is set only by the limits of the present technology in obtaining thinner films and, while the previous discussion emphasized the formation of semiconductor devices in thin silicon films for use at room temperature, induced semiconductor devices can be usefully formed in thicker silicon slices for low temperature application or to form devices in those compounds having wide band-gaps antigallium arsenide, silicon carbide and aluminum antimonide for room temperature operation.

Since it is obvious that many changes and modifications can be made in the above-described details without departing from the nature and spirit of the invention it is to be understood that the invention is not limited to said details except as set forth in the appended claims.

What is claimed is:

1. A semiconducting device comprising:

a thin semiconducting film;

a plurality of electrodes adjacent to said film;

means for electrically insulating said electrodes from said film;

biasing means of opposite polarity applied between a pair of adjacent electrodes and said film such that at least one n-type region and at least one p-type region is induced in said film, said adjacent electrodes spaced with respect to each other such that their induced regions adjoin each other and form a p-n junction, and contact means in connection to said induced p- and n-regions thereby providing a current path across said junction.

2. A semiconducting device as described in claim 1 wherein said contact means in connection to said p- and n-regions induced within said film include a chemically doped n-region adjoining said induced n-region and a chemically doped p-region adjoining said induced p-region.

3. A semiconducting device as claimed in claim 1 including means substantially depleting the mobile charges from portions of said semiconducting film adjacent thereto, said depleting means located adjacent a surface of said film opposite to the surface facing one of said electrodes whereby the mobile charges are depleted from the portion of said film underlying said one electrode.

4. A semiconducting device as described in claim 3 wherein said plurality of electrodes are located adjacent one surface of said film, and said charge depletion means comprises at least one metal depletion electrode placed adjacent to and insulated from the surface of the film opposite said one surface, and including biasing means applied between the depletion electrode and said film.

5. A semiconducting device as described in claim 3 including a substrate of insulative material, and wherein said film is disposed on the upper surface of said substrate, at least one of said electrodes is disposed over the upper surface of said film, and said charge depletion means comprises a metal depletion electrode located on the lower surface of said substrate, and said depletion electrode having a work function difference with respect to said film so as to generate the required depletion field.

6. A semiconducting device as described in claim 3 wherein said charge depletion means comprises an insulative layer disposed on said surface opposite said one electrode, and said insulative layer providing an interface charge concentration located at the adjoining surface of said film.

7. A semiconducting device as described in claim 3 wherein said charge depletion means consists of an insulator adjacent to said semiconducting film, said insulator having foreign ions of sufficient concentration to establish a space charge of sufficient magnitude to generate the required depletion field.

8. A semiconducting device as described in claim 5 wherein said semiconducting film is n-type silicon and said metal depletion electrode is selected from the group comprising platinum, palladium, nickel and gold.

9. A semiconducting device as described in claim 6 wherein said semiconducting film is n-type silicon and said charge depletion means comprises a layer of silicon dioxide adjacent to said film.

10. A semiconducting device according to claim 2 wherein said semiconducting film is silicon and including an isolating substrate of sapphire underlaying said film.

11. A semiconducting device consisting of a thin semiconducting film of low conductivity sandwiched between two insulating layers, a first electrode on one of these insulating layers, and a second electrode on the other insulating layer, said first and second electrodes arranged in such a manner that the normal projection of said first electrode on the plane of said second electrode overlaps part of said second electrode, means for application of potentials of opposite polarity between said electrodes and said film such as to induce conductive regions of opposite conductivity on opposite surfaces of said semiconducting film, said regions having p and n conductivity types said regions meeting within said film and forming a p-n junction, and means in connection to said conductive regions for providing a current path from the p-region on one surface of said semiconducting film through the junction to the adjacent portion of the n-region on the other surface of said semiconducting film, said current in said current path being controlled by the potentials applied to said first and said second electrode.

12. A semiconducting device according to claim 1 wherein said first electrode at least partially overlaps said second electrode such that their induced regions adjoin one another.

13. A semiconductive device as claimed in claim 12 including a third electrode disposed in spaced relation to said first electrode and at least partially overlapping relation to said second electrode, means for applying a bias between said third electrode and said film, said bias applied to said third electrode being of opposite polarity to that of said second electrode so as to induce a third region and a second p-n junction in said film, and contact means in connection to said third region.

References Cited

UNITED STATES PATENTS

| | | | |
|---|---|---|---|
| 3,339,128 | 8/1967 | Olmstead | 317—235 |
| 3,473,032 | 10/1969 | Lehovec | 250—211 |
| 3,463,977 | 8/1969 | Grove | 317—235 |
| 3,328,210 | 6/1967 | McCaldin | 148—1.5 |
| 3,258,663 | 6/1966 | Weimer | 317—235 |

JOHN W. HUCKERT, Primary Examiner

M. H. EDLOW, Assistant Examiner

U.S. Cl. X.R.

307—304

UNITED STATES PATENT OFFICE
CERTIFICATE OF CORRECTION

Patent No. 3,564,355 Dated February 16, 1971

Inventor(s) Kurt Lehovec

It is certified that error appears in the above-identified patent and that said Letters Patent are hereby corrected as shown below:

Column 4, line 52, after "given" insert -- by -
Column 4, line 63, change "$Nqd_{\infty}\varepsilon_o$" to read
-- $Nqd_{\infty}/\varepsilon_o$ --
Column 5, line 75, after "pletion" insert
-- potential --
Column 6, line 27, change "n-region" to
-- p-region --
Column 6, line 65, omit "anti-" and insert
-- such as --

Signed and sealed this 8th day of June 1971.

(SEAL)
Attest:

EDWARD M.FLETCHER,JR.
Attesting Officer

WILLIAM E. SCHUYLER, JR
Commissioner of Patents